(12) United States Patent
Tang et al.

(10) Patent No.: US 9,774,326 B2
(45) Date of Patent: Sep. 26, 2017

(54) CIRCUIT AND METHOD FOR GENERATING CLOCK-SIGNALS

(71) Applicant: Semiconductor Manufacturing International (Shanghai) Corporation, Shanghai (CN)

(72) Inventors: Hua Tang, Shanghai (CN); Fei Liu, Shanghai (CN); Chia Chi Yang, Shanghai (CN); Benpeng Xun, Shanghai (CN); Haifeng Yang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/168,335

(22) Filed: May 31, 2016

(65) Prior Publication Data

US 2016/0352334 A1    Dec. 1, 2016

(30) Foreign Application Priority Data

Jun. 1, 2015  (CN) .......................... 2015 1 0293013

(51) Int. Cl.
*H03K 3/00*    (2006.01)
*H03K 19/00*   (2006.01)
*H03K 5/151*   (2006.01)

(52) U.S. Cl.
CPC ....... *H03K 19/0016* (2013.01); *H03K 5/1515* (2013.01)

(58) Field of Classification Search
None
See application file for complete search history.

(56) References Cited

U.S. PATENT DOCUMENTS

| 5,602,496 A   | * | 2/1997 | Mahmood | ............ H03K 3/3565 326/24 |
| 7,034,595 B2  | * | 4/2006 | Lee     | ...................... H03K 5/1565 327/233 |
| 2005/0040875 A1 | * | 2/2005 | Lee   | ...................... H03K 5/1565 327/291 |

* cited by examiner

*Primary Examiner* — Long Nguyen
(74) *Attorney, Agent, or Firm* — Anova Law Group, PLLC

(57) ABSTRACT

The present disclosure provides circuits and methods for generating clock-signals. An exemplary clock-signal generation circuit includes a delay buffer unit; an inverter unit coupled to the delay buffer unit; a first delay unit having a first NAND Boolean calculation sub unit, a first sub delay unit and a first level shift unit sequentially connected in serial, coupled to the inverter unit and configured for generating a first delayed clock-signal; and a second delay unit having a second NAND Boolean calculation sub unit, a second sub delay unit and a second level shift unit sequentially connected in serial, coupled to the inverter unit and configured for generating a second delayed clock signal.

19 Claims, 4 Drawing Sheets

CIRCUIT AND METHOD FOR GENERATING CLOCK-SIGNALS

CROSS-REFERENCES TO RELATED APPLICATIONS

This application claims the priority of Chinese patent application No. 201510293013.7, filed on Jun. 1, 2015, the entirety of which is incorporated herein by reference.

FIELD OF THE INVENTION

The present invention generally relates to the field of clock circuit technology and, more particularly, relates to circuits and methods for generating clock-signals.

BACKGROUND

The clock-signal generation circuit usually provides repeated signals with a constant period. The repeated signals are used to time the digital synchronized circuit, such as Analog-to-Digital converter (ADC), etc.

Non-overlapping clock-signal is a typical type of clock-signal provided by a clock-signal generation circuit. The non-overlapping clock-signal is normally used in switched-capacitor integrator circuit. The non-overlapping clock-signal is used to generate non-inverted clock-signal and inverted clock-signal. The non-inverted clock-signal and the inverted clock-signal transit between the corresponding delayed non-inverted clock-signal and the delay inverted clock-signal. The transition between the non-inverted clock-signal and the inverted clock-signal also has a delay.

When the non-overlay clock-signal is applied in switched-capacitor integrator used by the high-speed ADC circuit, the non-overlapping time and the clock phase delay are often realized by the invertor delay. In the conventional multiple clock domain non-overlapping clock-signal generation circuit, the non-overlapping time and the clock phase delay are often realized by increasing the invertor time delay of the delay line. However, such approaches may affect the reliability, and increase the power consumption.

The disclosed circuits are directed to solve one or more problems set forth above and other problems in the art.

BRIEF SUMMARY OF THE DISCLOSURE

The present disclosure includes a clock-signal generation circuit. An exemplary clock-signal generation circuit includes a delay buffer unit; an inverter unit coupled to the delay buffer unit; a first delay unit having a first NAND Boolean calculation sub unit, a first delay sub unit and a first level shift unit sequentially connected in serial, coupled to the inverter unit and configured for generating a first delayed clock-signal; and a second delay unit having a second NAND Boolean calculation sub unit, a second sub delay unit and a second level shift unit sequentially connected in serial, coupled to the inverter unit and configured for generating a second delayed clock signal.

Another aspect of the present disclosure includes a method for generating clock-signals. The method includes providing a clock-signal generation circuit including a delay buffer unit, an inverter unit coupled to the delay buffer unit, a first delay unit having a first NAND Boolean calculation sub unit, a first sub delay unit and a first level shift unit sequentially connected in serial, coupled to the inverter unit and configured for generating a first delayed clock signal, and a second delay unit having a second NAND Boolean calculation sub unit, a second sub delay unit and a second level shift unit sequentially connected in serial, coupled to the inverter unit and configured for generating a second delayed clock-signal; providing a pre-set clock-signal to an input terminal of the delay buffer unit; and generating a first clock-signal from an output terminal of the first sub delay unit, a second clock-signal from an output terminal of the second sub delay unit, the first delayed clock-signal from an output terminal of the first level shift unit, and the second delayed clock-signal from an output terminal of the second level shift unit, respectively.

Other aspects of the present disclosure can be understood by those skilled in the art in light of the description, the claims, and the drawings of the present disclosure.

DETAILED DESCRIPTION

Figure 1:
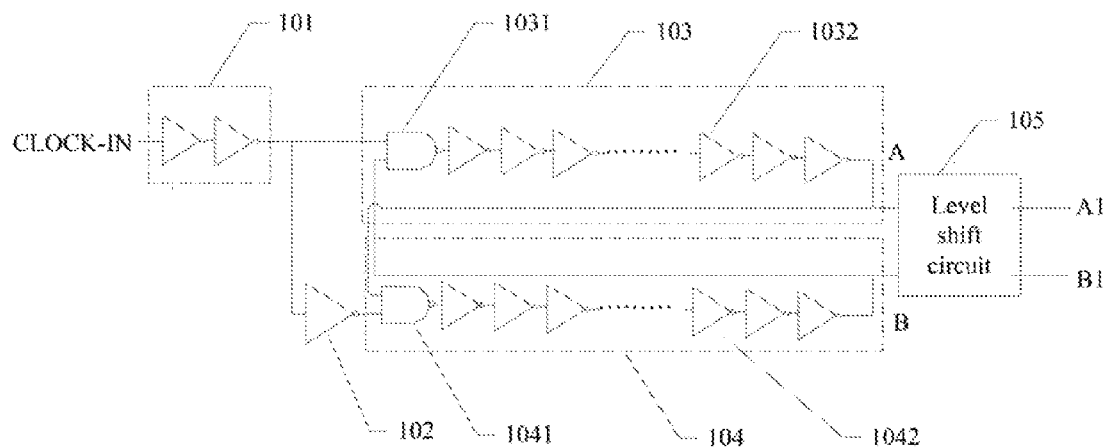
FIG. 1 illustrates an existing clock-signal generation circuit.

FIG. 1 illustrates an existing non-overlapping clock-signal generation circuit. As shown in FIG. 1, the existing non-overlapping clock-signal generation circuit includes a delay buffer circuit 101, an inverter 102, a first delay line circuit 103, a second delay line circuit 104, and a level shift circuit 105.

The first delay line circuit 103 includes a first NAND gate 1031 and a first delay circuit 1032. The second delay line circuit 104 includes a second NAND gate 1041 and a second delay circuit 1042. The structure of the first delay circuit 1032 is identical to the second delay circuit 1042.

The input terminal of the delay buffer circuit 101 is coupled to a pre-set clock-signal CLOCK-IN. The output terminal of the delay buffer circuit 101 is coupled to the first input terminal of the first NAND gate 1031 and the input terminal of the inverter 102, respectively.

The second input terminal of the first NAND gate 1031 is coupled to the output terminal of the second delay circuit 1042. The output terminal of the first NAND gate 1031 is coupled to the input terminal of the first delay circuit 1032.

The output terminal of the first delay circuit 1032 is coupled to a first input terminal of the level shift circuit 105 and the first input terminal of the second NAND gate 1041, respectively. The output terminal of the second NAND gate 1041 is coupled to the input terminal of the second delay unit 1042. The output terminal of the second delay circuit 1042 is coupled to a second input terminal of the level shift circuit 105 and the second input terminal of the first NAND gate 1031, respectively.

When the clock-signal generation circuit is in operation, the pre-set clock-signal CLOCK-IN is inputted in the delay buffer circuit 101, a first clock-signal A is outputted from the output terminal of the first delay circuit 1032; and a second clock-signal B is outputted from the output terminal of the second delay circuit 1042. The first clock-signal A and the second clock-signal B pass through the level shift circuit 105; and a third clock-signal A1 and a fourth clock-signal B1 are outputted, respectively. The output waveforms of the first clock-signal A, the second clock-signal B, the third clock-signal A1 and the fourth clock-signal B1 are illustrated in FIG. 2.

Figure 2:
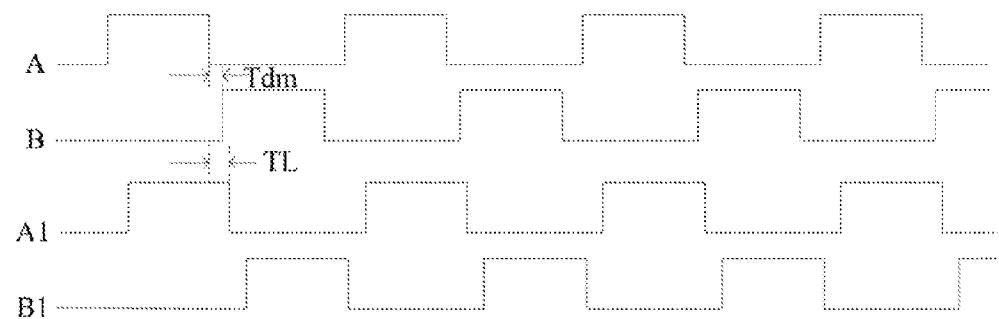
FIG. 2 illustrates waveforms of four clock-signals generated by the clock-signal generation circuit illustrated in FIG. 1.

As shown in FIG. 2, the relative delay between the first clock-signal A and the second clock-signal B may be identical to the relative delay between the third clock-signal A1 and the fourth clock-signal B1. The relative delay is the time delay "Tdm" of the first delay circuit 1032 or the second delay circuit 1042. At the same time, the time delay between the first clock-signal A and the third clock-signal A1 is the time delay "TL" of the level shift circuit 105.

However, the time delay "TL" is usually affected by fabrication process, temperature, parasitic capacitance, etc. of the device components of the circuit; and the time delay "TL" may be greater than the time delay "Tdm". When the time delay "TL" is greater than the time delay "Tdm", it may cause the second clock-signal "B" and the third clock-signal "A1" to be at a high level simultaneously. Such a condition may significantly affect the performance of the clock-signal generation circuit, especially in a high-speed circuit.

To solve such an issue, the time delay "Tdm" of the first delay circuit 1032 or the second delay circuit 1042 of the clock-signal generation circuit illustrated in FIG. 1 may be increased. That is, the number of the inverters in the first delay circuit 1032 or the second delay circuit 1042 is increased to control the time delay "Tdm" to be greater than the time delay "TL".

However, being affected by the variety of external factors, such an approach may be still unable to ensure the time delay "Tdm" to be greater than the time delay "TL". Thus, the reliability of the clock-signal generation circuit may by unacceptable. Further, increasing the number of the inverters in the first delay circuit 1032 and the second delay circuit 1042 may increase the power consumption of the clock-signal generation circuit.

To solve one or more problems set forth above and other problems, in the present disclosure, the level shift circuit may be moved to the first delay circuit and the second delay circuit. Such a design may ensure the clock-signals generated by the clock-signal generation circuit not to be at a high level at the same. Thus, the reliability of the non-overlapping clock-signals generated by the disclosed clock-signal generation circuit may be improved; and the power consumption of the entire clock-signal generation circuit may be reduced; and the energy may be saved.

Reference will now be made in detail to exemplary embodiments of the invention, which are illustrated in the accompanying drawings. Wherever possible, the same reference numbers will be used throughout the drawings to refer to the same or like parts.

Figure 3A:
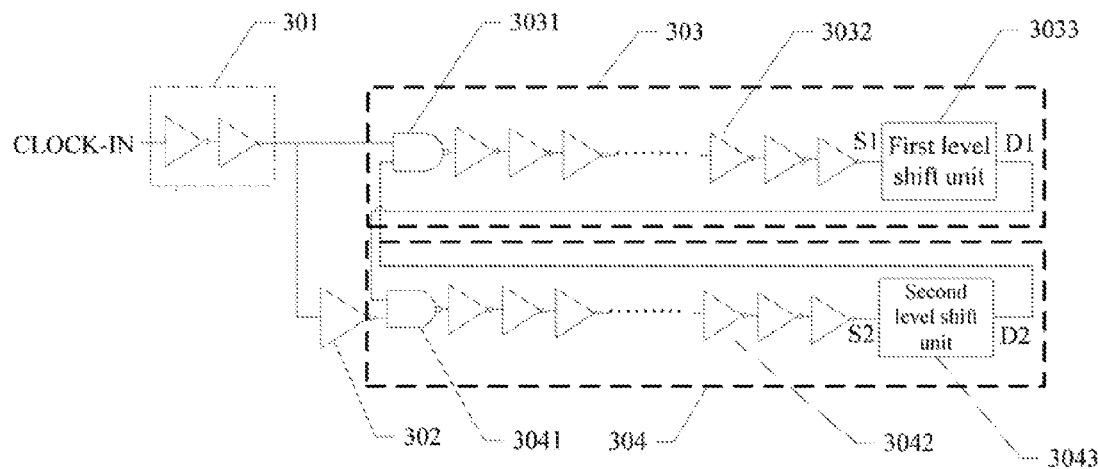
FIGS. 3a-3c illustrate exemplary clock-signal generation circuits consistent with the disclosed embodiments.

FIG. 3*a* illustrates an exemplary clock-signal generation circuit consistent with the disclosed embodiments.

As shown in FIG. 3*a*, the clock-signal generation circuit may include a delay buffer unit 301, an inverter unit 302, a first delay unit 303 and a second delay unit 304.

Figure 3B:
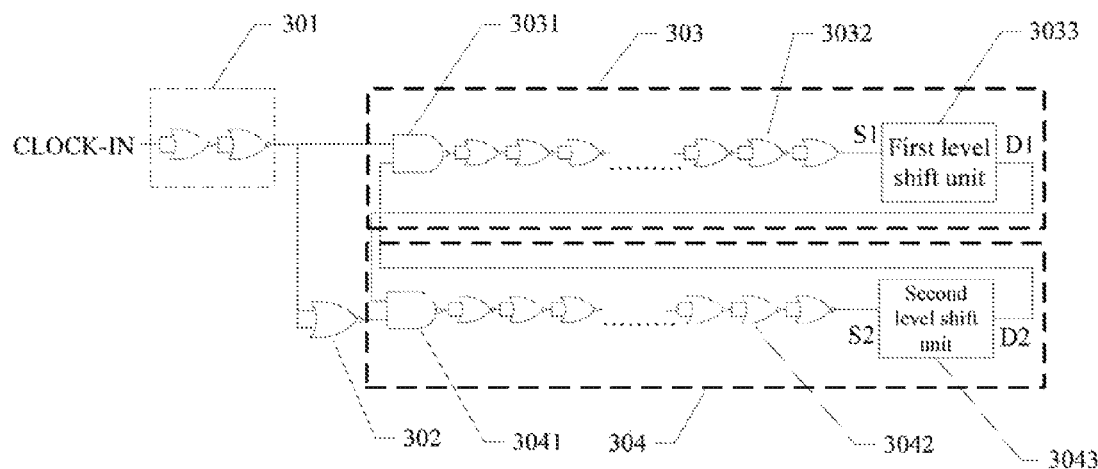

In one embodiment, as shown in FIG. 3*b*, the delay buffer unit 301 may include two NOR gates connected in serial. The inverter unit 302 may include one NOR gate.

In certain other embodiments, the number of the NOR gates included in the delay buffer unit 301 and the number of the NOR gates included inverter unit 302 may be other appropriate number.

The input terminal of the delay buffer unit 301 may be coupled to a clock-signal CLOCK-IN. The clock signal CLOCK-IN may have a pre-set duty cycle. The output terminal of the delay buffer unit 301 may be coupled to a first input terminal of the first delay unit 303; and may be coupled to the first input terminal of the second delay unit 304 through the invertor unit 302. The output terminal of the first delay unit 303 may be coupled to the second terminal of the second delay unit 304. Further, a first delayed clock-signal "D1" may be generated from the output terminal of the first delay unit 303. The output terminal of the second delay unit 304 may be coupled to the second input terminal of the first delay unit 303. Further, a second delayed clock-signal "D2" may be generated from the output terminal of the second delay unit 304.

The first delay unit 303 may include a first NAND Boolean calculation sub unit 3031, a first sub delay unit 3032 and a first level shift circuit 3033 sequentially connected in serial. A first clock-signal "S1" may be outputted from an output terminal of the first level shift unit 3033.

The second delay unit 304 may include a second NAND Boolean calculation sub unit 3041, a second sub delay unit 3042 and a second level shift circuit 3043 sequentially connected in serial. A second clock-signal may be outputted from the output terminal of the second level shift unit 3043.

The first NAND Boolean calculation sub unit 3031 may be identical to the second NAND Boolean calculation sub unit 3041. The first sub delay unit 3032 may be identical to the second sub delay unit 3042. The first level shift circuit 3033 may be identical to the second level shift circuit 3043.

In one embodiment, as shown in FIG. 3*b*, the first sub delay unit 3032 may include two or more NOR gates connected in serial. The second sub delay unit 3042 may include two or more NOR gates connected in serial.

In one embodiment, after the pre-set clock-signal CLOCK-IN is inputted from the delay buffer circuit 301, the first clock-signal "S1" may be outputted from the output terminal of the first sub delay unit 3032; and the second clock-signal "S2" may be outputted from the output terminal of the second sub delay unit 3042.

The first clock-signal "S1" outputted from the first sub delay unit 3032 may pass through the first level shift unit 3033; and the first delayed clock-signal "D1" may be outputted. The second clock-signal "S2" outputted from the second sub delay unit 3042 may pass through the second level shift unit 3043; and the second delayed clock-signal "D2" may be outputted.

Figure 4:
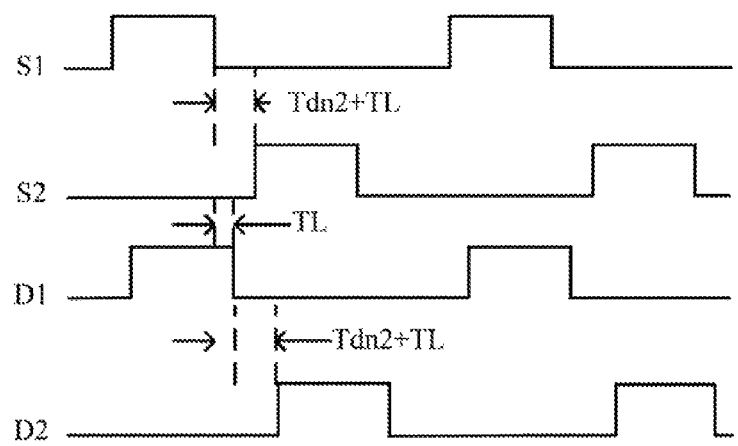
FIG. 4 illustrates exemplary waveforms of four clock-signals generated by the clock-signal generation circuit illustrated in FIG. 3.

FIG. 4 illustrates exemplary waveforms of the first clock-signal "S1", the second clock-signal "S2", the first delayed clock-signal "D1" and the second delayed clock-signal "D2" consistent with the disclosed embodiments.

As shown in FIG. 4, the relative time delay between the first delayed clock-signal "D1" and the second clock-signal "S2" may be a time delay generated by the second sub delay unit 3042. The relative delay between the first clock-signal "S1" and the second delayed clock-signal "D2" may be a time delay generated by the first sub delay unit 3032. Because the structure of the first sub delay unit 3032 may be identical to structure of the second sub delay unit 3042, the time delay of generated by the first sub delay unit 3032 and the time delay generated by the second sub delay unit 3042 may be identical.

Figure 3C:
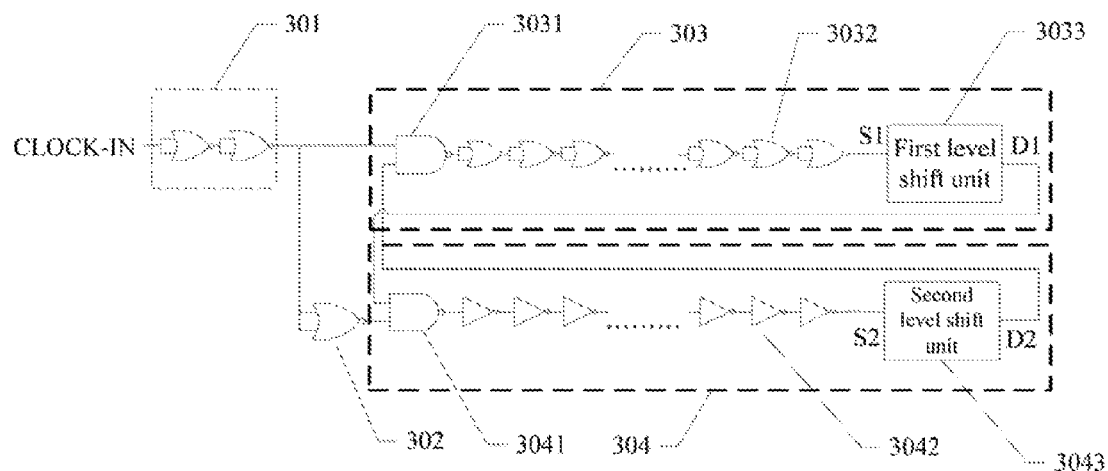

In certain other embodiments, as shown in FIG. 3*c*, the structure of the first sub delay unit 3032 may be different from the structure of the second sub delay unit 3042. Thus, the time delay of generated by the first sub delay unit 3032 and the time delay generated by the second sub delay unit 3042 may be different.

Further, the time delay between the first clock-signal "S1" and the first delayed clock-signal "D1" may be the time delay generated by the first level shift unit 3033. The time delay between the second clock-signal "S2" and the second delay clock-signal "D2" may be the time delay generated by the second level shift circuit 3043. In one embodiment, the first level shift unit 3033 may be identical to the second level shift unit 3043, thus the time delay generated by the first level shift unit 3033 may be identical to the time delay generated by the second level shift unit 3043.

At the same time, the time delay between the first clock-signal "S1" and the second clock-signal "S2" may have the following relationship:

$$Tdn = Tdn2 + TL \qquad (1)$$

Where Tdn is the time delay between the first clock-signal "S1" and the second clock-signal "S2". Tdn2 is the time delay of the second sub delay unit 3042, i.e., the relative time delay between the first delayed clock-signal "D1" and the second clock-signal "S2". TL is the time delay generated by the first level shift unit 3033, or the second level shift unit 3043 if the first level shift unit 3033 is identical to the second level shift unit 3043.

Similarly, the first delayed clock-signal "D1" and the second delayed clock-signal "D2" may also have the relationship presented in the equation (1) if the first sub delay unit 3032 is identical to the second sub delay unit 3042.

That is, the non-overlapping time between the first clock-signal "S1" and the second clock-signal "S2" may be Tdn2+TL. The non-overlapping time between the first delayed clock-signal "D1" and the second delayed clock-signal "D2" may be Tdn2+TL. Further, the first clock-signal "S1" and the second clock-signal "S2" may be at a power domain different from that of the first delayed clock-signal "D1" and the second delay clock-signal "D2".

According the equation (1), because Tdn2 is greater than 0, the time delay between the first clock-signal "S1" and the second clock-signal "S2" may be greater than the time delay between the first clock-signal "S1" and the first delayed clock-signal "D1", i.e., TL, the time delay generated by the first level shift unit 3033. Similarly, the time delay between the first delayed clock-signal "D1" and the second delayed clock-signal "D2" may also be greater than the time delay between the second clock-signal "S2" and the second delay clock-signal "D2", i.e., TL, the time delay generated by the second level shift unit 3043 because Tdn2 is greater than 0. Thus, the first clock-signal "S1" and the second delay clock-signal "D2" may not all be at the high level at the same time. The second clock-signal "S2" and the first delayed clock-signal "D1" may not all be at the high level at the same time. Therefore, reliable non-overlapping clock-signals in different power domains may be generated by the disclosed circuit.

Further, the first level shift unit 3033 and the second level shift unit 3043 may have a delay function in the first delay unit 303 and the second delay unit 304, respectively. Thus, the number of the inverters in the first delay unit and the second delay unit may be reduced. Accordingly, the power consumption of the entire clock-signal generation circuit may be reduced; and the energy may be saved.

In certain other embodiments, if the structure of the first level shift unit is different from the structure of the second level shift unit; and/or the first sub delay unit is different from the second sub delay unit, by a proper design, one may also achieve that the first clock-signal and the second delayed clock-signal are not at the high level at the same time; and the second clock-signal and the first delayed clock-signal are not at the high level at the same time using the disclosed clock-signal generation circuit.

Figure 5:
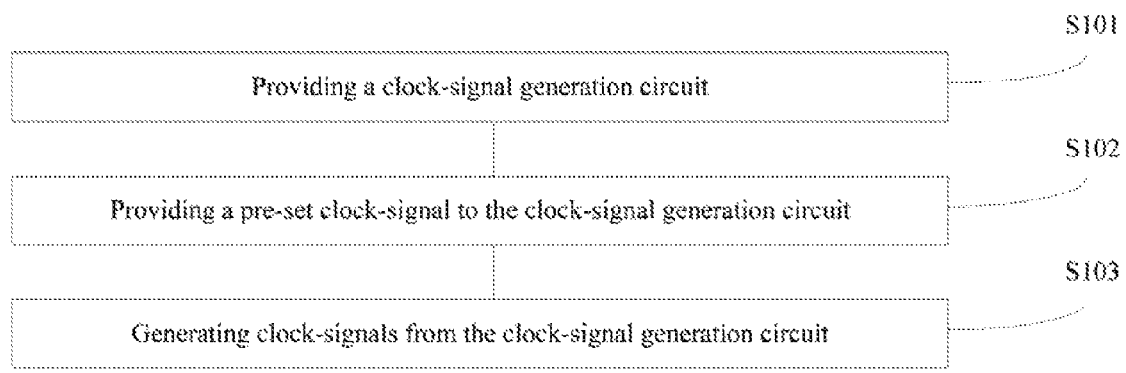
FIG. 5 illustrates an exemplary method for generating clock-signals.

Thus, a clock-signal generation method is provided by the disclosed non-overlapping clock-signal generation circuit. FIG. 5 illustrates an exemplary clock-signal generation method.

As shown in FIG. 5, the method includes providing a clock-signal generation circuit (S101). The clock-signal generation circuit may include a delay buffer unit; an inverter unit coupled to the delay buffer unit; a first delay unit having a first NAND Boolean calculation sub unit, a first sub delay unit and a first level shift unit sequentially connected in serial, coupled to the inverter unit and configured for generating a first delayed clock signal; and a second delay unit having a second NAND Boolean calculation sub unit, a second sub delay unit and a second level shift unit sequentially connected in serial, coupled to the inverter unit and configured for generating a second clock signal. The method may also include providing a pre-set clock-signal to an input terminal of the delay buffer unit (S102); and generating a first clock-signal from an output terminal of the first sub delay unit, a second clock-signal from an output terminal of the second sub delay unit, the first delayed clock-signal from an output terminal of the first level shift unit, and the second delayed clock-signal from an output terminal of the second level shift unit, respectively (S103).

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A clock-signal generation circuit, comprising:
   a delay buffer unit;
   an inverter unit coupled to the delay buffer unit;
   a first delay unit having a first NAND Boolean calculation sub unit, a first sub delay unit and a first level shift unit sequentially connected in serial, coupled to the inverter unit and configured for generating a first delayed clock-signal, the first sub delay unit generating a first clock-signal; and
   a second delay unit having a second NAND Boolean calculation sub unit, a second sub delay unit and a second level shift unit sequentially connected in serial, coupled to the inverter unit and configured for generating a second delayed clock signal, the second sub delay unit generating a second clock-signal, wherein the first clock-signal and the second delayed clock signal are not at a high level at a same time, and the second clock-signal and the first delayed clock signal are not at the high level at a same time.

2. The clock-signal generation circuit according to claim 1, wherein:
   an input terminal of the delay buffer unit is coupled to a pre-set clock-signal CLOCK-IN having a pre-set duty cycle;
   an output terminal of the delay buffer unit is coupled to a first input terminal of the first delay unit and is coupled to a first input terminal of the second delay unit through the inverter unit;
   an output terminal of the first delay unit is coupled to a second terminal of the second delay unit; and an output terminal of the second delay unit is coupled to a second input terminal of the first delay unit.

3. The clock-signal generation circuit according to claim 1, wherein:
a structure of the first sub delay unit is identical to a structure of the second sub delay unit; and
a structure of the first level shift unit is identical to a structure of the second level shift unit.

4. The clock-signal generation circuit according to claim 1, wherein the delay buffer unit comprises:
at least two NOR gates connected in serial.

5. The clock-signal generation circuit according to claim 1, wherein the inverter unit comprises:
at least one NOR gate.

6. The clock-signal generation circuit according to claim 1, wherein the first sub delay unit comprises:
at least two NOR gates connected in serial.

7. The clock-signal generation circuit according to claim 1, wherein the second sub delay unit comprises:
at least two NOR gates connected in serial.

8. The clock-signal generation circuit according to claim 1, wherein:
a structure of the first delay unit is different from a structure of the second delay unit.

9. The clock-signal generation circuit according to claim 1, wherein:
a structure of the first level shift unit is different from a structure of the second level shift unit.

10. The clock-signal generation circuit according to claim 1, wherein the first level shift unit and the second level shift unit are configured to translate the first clock-signal from a voltage swing to a different voltage swing.

11. A method for generating clock-signals, comprising:
providing a clock-signal generation circuit including a delay buffer unit, an inverter unit coupled to the delay buffer unit, a first delay unit having a first NAND Boolean calculation sub unit, a first sub delay unit and a first level shift unit sequentially connected in serial, coupled to the inverter unit and configured for generating a first delayed clock signal, and a second delay unit having a second NAND Boolean calculation sub unit, a second sub delay unit and a second level shift unit sequentially connected in serial, coupled to the inverter unit and configured for generating a second delayed clock signal;
providing a pre-set clock-signal to an input terminal of the delay buffer unit; and
generating a first clock-signal from an output terminal of the first sub delay unit, a second clock-signal from an output terminal of the second sub delay unit, the first delayed clock-signal from an output terminal of the first level shift unit, and the second delayed clock-signal from an output terminal of the second level shift unit, respectively, wherein the first clock-signal and the second delayed clock signal are not at a high level at a same time, and the second cock-signal and the first delayed clock signal are not at the high level at a same time.

12. The method according to claim 11, wherein:
a power domain of the first clock-signal and the second clock signal is different from a power domain of the first delayed clock-signal and the second delayed clock-signal.

13. The method according to claim 11, wherein:
an output terminal of the delay buffer unit is coupled to a first input terminal of the first delay unit, and is coupled to a first input terminal of the second delay unit through the inverter unit;
an output terminal of the first delay unit is coupled to a second terminal of the second delay unit; and
an output terminal of the second delay unit is coupled to a second input terminal of the first delay unit.

14. The method according to claim 11, wherein:
a structure of the first sub delay unit is identical to a structure of the second sub delay unit; and
a structure of the first level shift unit is identical to a structure of the second level shift unit.

15. The method according to claim 11, wherein the delay buffer unit comprises:
at least two NOR gates connected in serial.

16. The method according to claim 11, wherein the first sub delay unit comprises:
at least two NOR gates connected in serial.

17. The method according to claim 11, wherein the second sub delay unit comprises:
at least two NOR gates connected in serial.

18. The method according to claim 11, wherein:
the pre-set clock-signal has a pre-set duty cycle.

19. The method according to claim 11, wherein the first level shift unit and the second level shift unit are configured to translate the first clock-signal from a voltage swing to a different voltage swing.

* * * * *